(12) United States Patent
Wang et al.

(10) Patent No.: US 11,961,850 B2
(45) Date of Patent: Apr. 16, 2024

(54) DISPLAY SUBSTRATE, MANUFACTURING METHOD THEREOF, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Bejing (CN)

(72) Inventors: Dongfang Wang, Beijing (CN); Tongshang Su, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/214,181

(22) Filed: Jun. 26, 2023

(65) Prior Publication Data

US 2023/0352494 A1 Nov. 2, 2023

Related U.S. Application Data

(63) Continuation of application No. 17/288,589, filed as application No. PCT/CN2020/109513 on Aug. 17, 2020.

(30) Foreign Application Priority Data

Aug. 23, 2019 (CN) .......................... 201910785535.7

(51) Int. Cl.
*H01L 27/12* (2006.01)

(52) U.S. Cl.
CPC ...... *H01L 27/1255* (2013.01); *H01L 27/1225* (2013.01); *H01L 27/1248* (2013.01); *H01L 27/127* (2013.01)

(58) Field of Classification Search
CPC ............. H01L 27/1255; H01L 27/1225; H01L 27/1248; H01L 27/127; H01L 29/78633; H01L 27/1259; H01L 28/60
See application file for complete search history.

(56) References Cited

U.S. PATENT DOCUMENTS

2012/0169229 A1 7/2012 You et al.

OTHER PUBLICATIONS

Non-final office Action of U.S. Appl. No. 17/288,589 issued on Dec. 7, 2023.

*Primary Examiner* — Elias Ullah
(74) *Attorney, Agent, or Firm* — Lippes Mathias LLP

(57) ABSTRACT

Provided is a display substrate. The display substrate includes a base substrate, and a pixel unit disposed on the base substrate. The pixel unit includes a storage capacitor, the storage capacitor includes a first plate and a second plate facing each other, and a plate of the storage capacitor is a transparent plate. The pixel unit further includes an active layer and a source/drain pattern, which are disposed in two different layers.

20 Claims, 11 Drawing Sheets

DISPLAY SUBSTRATE, MANUFACTURING METHOD THEREOF, AND DISPLAY DEVICE

This application is a continuation of U.S. patent application Ser. No. 17/288,589, filed on Apr. 26, 2021 and entitled "DISPLAY SUBSTRATE, MANUFACTURING METHOD THEREOF, AND DISPLAY DEVICE," which is a 371 of PCT Application No. PCT/CN2020/109513, filed on Aug. 17, 2020, which claims priority to Chinese Patent Application No. 201910785535.7, filed on Aug. 23, 2019, the entire contents of which are incorporated herein by reference.

TECHNICAL FIELD

The present disclosure relates to a display substrate and a method for manufacturing the same, and a display device.

BACKGROUND

With the continuous development of the display industry, users have higher and higher requirements for display substrates, and thus high-quality display substrates are more favored by users.

SUMMARY

The present disclosure provides a display substrate and a method for manufacturing the same, and a display device. The technical solutions of the present disclosure are summarized as follows.

In one aspect, a display substrate is provided. The display substrate includes: a base substrate; and a pixel unit disposed on the base substrate, wherein the pixel unit includes a storage capacitor, a plate of the storage capacitor being a transparent plate.

Optionally, the storage capacitor includes a first plate and a second plate, wherein a material of the first plate includes metal oxide, and a material of the second plate includes a conductive semiconductor material.

Optionally, the material of the first plate includes at least one of indium tin oxide, indium zinc oxide, or aluminum-doped zinc oxide, and the material of the second plate includes at least one of conductive indium gallium zinc oxide or conductive indium tin zinc oxide.

Optionally, the pixel unit further includes an active layer and a source/drain pattern, which are disposed in two different layers; and the first plate includes a first sub-plate and a second sub-plate that are electrically connected, wherein the first sub-plate is disposed between the base substrate and the active layer, the second sub-plate and the source/drain pattern are disposed in the same layer, and the second plate and the active layer are disposed in the same layer.

Optionally, an insulating layer is arranged between the first sub-plate and the second sub-plate, wherein the insulating layer is provided with a connection hole, and the second sub-plate is electrically connected to the first sub-plate by the connection hole.

Optionally, the source/drain pattern is a transparent pattern.

Optionally, a material of the source/drain pattern includes at least one of indium tin oxide, indium zinc oxide, or aluminum-doped zinc oxide.

Optionally, the pixel unit further includes a light shielding layer, wherein the light shielding layer and the first sub-plate are disposed in the same layer, an orthographic projection of the active layer on the base substrate is within an orthographic projection of the light shielding layer on the base substrate, and the light shielding layer, the active layer, and the source/drain pattern are disposed in three different layers.

Optionally, the pixel unit further includes a buffer layer, a gate insulating layer, a gate, and an interlayer dielectric layer, wherein the buffer layer is disposed between the first sub-plate and the active layer, and the active layer, the gate insulating layer, the gate, the interlayer dielectric layer, and the source/drain pattern constitute a thin film transistor; and the insulating layer between the first sub-plate and the second sub-plate includes the buffer layer and the interlayer dielectric layer.

Optionally, the active layer, the interlayer dielectric layer, and the source/drain pattern are disposed in a direction going distally from the base substrate; the source/drain pattern includes a source and a drain; the interlayer dielectric layer is provided with a source via hole and a drain via hole, wherein the source is in contact with the active layer by the source via hole, and the drain is in contact with the active layer by the drain via hole; and the pixel unit further includes: a passivating layer, disposed on a side of the source/drain pattern distal from the base substrate and provided with a pixel via hole; and a pixel electrode, disposed on a side of the passivating layer distal from the base substrate and electrically connected to the drain by the pixel via hole.

Optionally, the gate insulating layer and the gate are sequentially disposed between the active layer and the interlayer dielectric layer in a direction going distally from the base substrate, and an orthographic projection of the gate insulating layer on the base substrate is coincident with an orthographic projection of the gate on the base substrate; or the gate and the gate insulating layer are sequentially disposed between the active layer and the base substrate in a direction going distally from the base substrate.

In another aspect, a method for manufacturing a display substrate is provided. The method includes: providing a base substrate; and forming a pixel unit on the base substrate, wherein the pixel unit includes a storage capacitor, a plate of the storage capacitor being a transparent plate.

Optionally, the storage capacitor includes a first plate and a second plate, wherein a material of the first plate includes metal oxide, and a material of the second plate includes a conductive semiconductor material.

Optionally, forming the pixel unit on the base substrate includes: forming a first sub-plate on the base substrate; forming an active layer and a second plate on the base substrate on which the first sub-plate is formed, wherein the active layer and the second plate are disposed in the same layer; and forming a source/drain pattern and a second sub-plate on the base substrate on which the active layer and the second plate are formed, wherein the source/drain pattern and the second sub-plate are disposed in the same layer, and the second sub-plate is electrically connected to the first sub-plate.

Optionally, forming the pixel unit on the base substrate further includes: forming a light shielding layer on the base substrate, wherein the first sub-plate and the light shielding layer are disposed in the same layer, and an orthographic projection of the active layer on the base substrate is within an orthographic projection of the light shielding layer on the base substrate.

Optionally, forming the pixel unit on the base substrate further includes: forming a buffer layer on the base substrate on which the light shielding layer and the sub-plate are formed; forming the active layer and the second plate on the base substrate on which the first sub-plate is formed includes: forming the active layer and the second plate on the base substrate on which the buffer layer is formed;

forming the pixel unit on the base substrate further includes: forming a gate insulating layer, a gate, and an interlayer dielectric layer on the base substrate on which the active layer and the second plate are formed, wherein the active layer, the gate insulating layer, the gate and the interlayer dielectric layer are disposed in a direction going distally from the base substrate, an orthographic projection of the gate insulating layer on the base substrate is coincident with an orthographic projection of the gate on the base substrate, and the interlayer dielectric layer is provided with a source via hole and a drain via hole; and forming a connection hole in the interlayer dielectric layer and the buffer layer; and forming the source/drain pattern and the second sub-plate on the base substrate on which the active layer and the second sub-plate are formed includes: forming the source/drain pattern and the second sub-plate on the base substrate on which the interlayer dielectric layer is formed, wherein the source/drain pattern includes a source and a drain, the source being in contact with the active layer by the source via hole and the drain being in contact with the active layer by the drain via hole, and the second sub-plate is electrically connected to the first sub-plate by the connection hole.

Optionally, forming the light shielding layer and the first sub-plate on the base substrate includes: forming a first conductive material layer on the base substrate, wherein the first conductive material layer includes a transparent conductive thin film and a light-shielding conductive thin film which are superimposed in a direction going distally from the base substrate; and acquiring the light shielding layer and the first sub-plate by processing the first conductive material layer by a one-time patterning process by using a first gray-scale mask plate, wherein the light shielding layer includes the transparent conductive thin film and the light-shielding conductive thin film which are superimposed, and the first sub-plate includes the transparent conductive thin film;

forming the active layer and the second plate on the base substrate on which the buffer layer is formed includes: forming a semiconductor material layer on the base substrate on which the buffer layer is formed; acquiring the active layer and a semiconductor plate by processing the semiconductor material layer by a one-time patterning process; and acquiring the second plate by performing the conductivity development treatment on the semiconductor plate;

forming the gate insulating layer, the gate, and the interlayer dielectric layer on base the substrate on which the active layer and the second plate are formed includes: forming an initial gate insulating layer on the base substrate on which the active layer and the second plate are formed; forming the gate on the base substrate on which the initial gate insulating layer is formed; acquiring the gate insulating layer by etching the initial gate insulating layer by taking the gate as a mask; and forming the interlayer dielectric layer on the base substrate on which the gate is formed; and forming the source/drain pattern and the second sub-plate on the base substrate on which the interlayer dielectric layer is formed includes: forming a second conductive material layer on the base substrate on which the interlayer dielectric layer is formed, wherein the second conductive material layer includes a transparent conductive thin film and a light-shielding conductive thin film which are superimposed in a direction going distally from the base substrate; and acquiring the source/drain pattern and the second sub-plate by processing the second conductive material layer by a one-time patterning process by using a second gray-scale mask plate, wherein the source/drain pattern includes the transparent conductive thin film and the light-shielding conductive thin film, and the second sub-plate includes the transparent conductive thin film.

Optionally, forming the pixel unit on the base substrate further includes: forming a buffer layer on the base substrate on which the light shielding layer and the first sub-plate are formed;

forming the active layer and the second plate on the base substrate on which the first sub-plate is formed includes: forming the active layer and the semiconductor plate on the base substrate on which the buffer layer is formed, wherein the active layer and the semiconductor plate are disposed in the same layer;

forming the pixel unit on the base substrate further includes: forming an initial gate insulating layer on the base substrate on which the active layer and the semiconductor plate are formed; forming the gate on the base substrate on which the initial gate insulating layer is formed; and acquiring the gate insulating layer by etching the initial gate insulating layer by taking the gate as a mask, and exposing the semiconductor plate, wherein an orthographic projection of the gate insulating layer on the base substrate is coincident with an orthographic projection of the gate on the base substrate;

forming the active layer and the second plate on the base substrate on which the first sub-plate is formed further includes: acquiring the second plate by performing the conductivity development treatment on the semiconductor plate;

forming the pixel unit on the base substrate further includes: forming the interlayer dielectric layer on the base substrate on which the gate is formed, wherein the interlayer dielectric layer includes a source via hole and a drain via hole; forming connection hole in the interlayer dielectric layer and the buffer layer; and forming the source/drain pattern and the second sub-plate on the base substrate on which the interlayer dielectric layer is formed, wherein the source/drain pattern includes a source and a drain, the source being in contact with the active layer by the source via hole and the drain being in contact with the active layer by the drain via hole, and the second sub-plate is electrically connected to the first sub-plate by the connection hole.

Optionally, forming the pixel unit on the base substrate further includes: forming a passivating layer on the base substrate on which the source/drain pattern and the second sub-plate are formed, wherein the passivating layer is provided with a pixel via hole; and forming a pixel electrode on the base substrate on which the passivating layer is formed, wherein the pixel electrode is electrically connected to the drain by the pixel via hole.

In yet another aspect, a display device is provided. The display device includes any of the base display substrate provided in the one aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

The drawings herein are incorporated into the description and constitute a part of the description, show embodiments that are consistent with the present disclosure, and are used together with the description to explain the principles of the present disclosure.

DETAILED DESCRIPTION

To make the principles, technical solutions and advantages of the present disclosure clearer, the present disclosure will be described in detail below in conjunction with the accompanying drawings. Of course, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

A pixel unit in a display substrate includes a pixel electrode, and a thin film transistor (TFT) and a storage capacitor which are electrically connected to the pixel electrode. The TFT is configured to apply an electrical signal to the pixel electrode during a scanning phase. The storage capacitor is configured to maintain a potential of the pixel electrode during a non-scanning phase. The storage capacitor occupies a certain area in the pixel unit, while a plate of the storage capacitor is made of an opaque material at present, resulting in a relatively small area of a non-opaque region of the pixel unit and a relatively low aperture ratio of the display substrate.

In view of this, embodiments of the present disclosure provide a display substrate and a method for manufacturing the same, and a display device. In this display substrate, since the plate of the storage capacitor is a transparent plate, the storage capacitor is capable of transmitting light. The storage capacitor does not affect the area of the non-opaque region of the pixel unit even if the storage capacitor occupies a certain area in the pixel unit, such that the area of the non-opaque area of the pixel unit is relatively large, and the aperture ratio of the display substrate is relatively high. The technical solutions according to the embodiments of the present disclosure will be introduced below in conjunction with the accompanying drawings.

Figure 1:
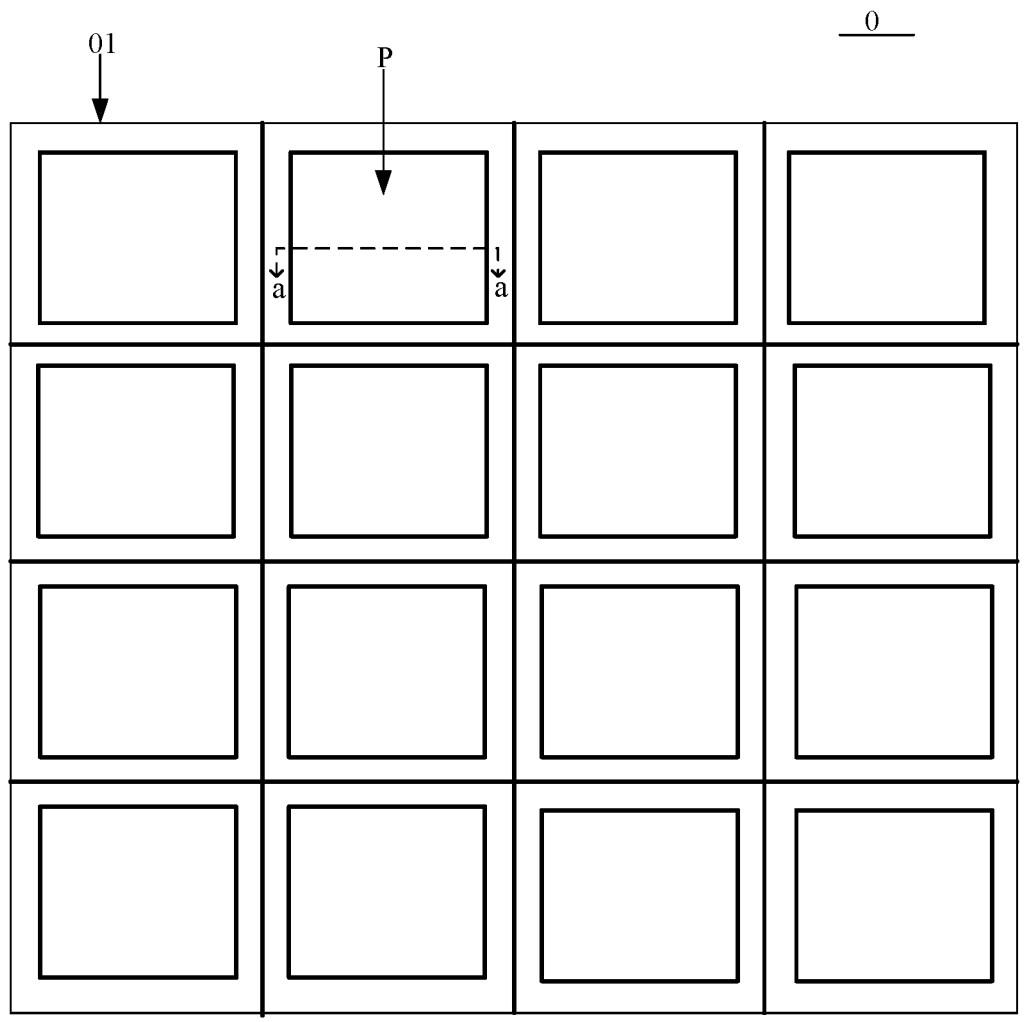
FIG. 1 is a front view of a display substrate according to an embodiment of the present disclosure.
Figure 2:
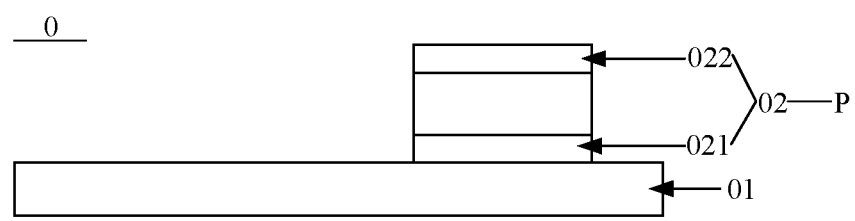
FIG. 2 is a sectional view of a display substrate according to an embodiment of the present disclosure.

In an exemplary embodiment, reference is made to FIG. 1 and FIG. 2. FIG. 1 is a front view of a display substrate 0 according to an embodiment of the present disclosure, and FIG. 2 is a sectional view of a display substrate 0 according to an embodiment of the present disclosure. FIG. 2 may be a sectional view of a part a-a on the display substrate 0 shown in FIG. 1. Referring to FIG. 1 and FIG. 2, the display substrate 0 includes a base substrate 01, and a pixel unit P disposed on the base substrate 01, wherein the pixel unit P includes a storage capacitor 02, and the plate of the storage capacitor 02 is a transparent plate.

In summary, according to the display substrate according to the embodiment of the present disclosure, since the pixel unit in the display substrate includes the storage capacitor and the plate of the storage capacitor is a transparent plate, the storage capacitor is capable of transmitting light, such that the area of the non-opaque region of the pixel unit is relatively large, and the aperture ratio of the display substrate is relatively high.

The base substrate 01 may be a rigid substrate made of a non-metallic transparent material with certain robustness, such as glass or quartz and the like. Alternatively, the base substrate 01 may be a flexible substrate made of a material such as polyimide (PI) and the like. A material of the plate of the storage capacitor 02 may be a transparent conductive material, such that the plate of the storage capacitor 02 may be a transparent plate. As shown in FIG. 2, the storage capacitor 02 includes a first plate 021 and a second plate 022 which are disposed in an opposing manner and insulated from each other. A material of the first plate 021 may include metal oxide, and a material of the second plate 022 may include a conductive semiconductor material. For example, the material of the first plate 021 may be one or a combination of more of indium tin oxide (ITO), indium zinc oxide (IZO), or aluminum-doped zinc oxide (ZnO:Al). The material of the second plate 022 may be one or a combination of more of conductive indium gallium zinc oxide (IGZO), or conductive indium tin zinc oxide (ITZO).

Optionally, the pixel unit P may include a TFT. The TFT may include a gate, a gate insulating layer, an active layer, an inter-layer dielectric layer, and a source/drain pattern. The TFT may be a bottom-gate type TFT or a top-gate type TFT, wherein a gate of the bottom-gate type TFT is disposed between the active layer and the base substrate, and a gate of the top-gate type TFT is distal from the base substrate relative to the active layer. In this embodiment of the present disclosure, when the TFT in the pixel unit P is the bottom-gate type TFT, the source/drain pattern may be a transparent pattern. In this way, a region where the source/drain pattern is disposed may be transmissible to light, such that the area of the non-opaque region of the pixel unit P may be increased, thereby increasing the aperture ratio of the display substrate 0. In an exemplary embodiment, when the source/drain pattern is a transparent pattern, the material of the source/drain pattern may be one or a combination of more of ITO, IZO, or ZnO:Al. When the TFT in the pixel unit is the top-gate type TFT, the pixel unit P may further include a light shielding layer. The light shielding layer may be disposed between the base substrate and the active layer to shield the active layer, thereby preventing the switching characteristic of the TFT from being affected by irradiating external light from the display substrate to the active layer.

In this embodiment of the present disclosure, the TFT in the pixel unit P is described by taking the top-gate type TFT as an example.

Figure 3:
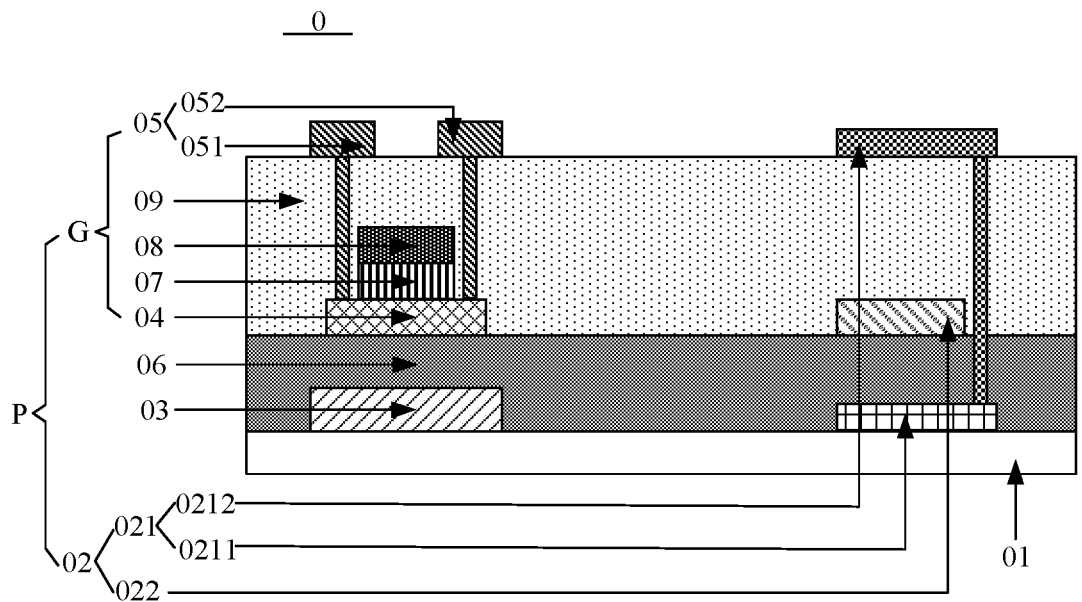
FIG. 3 is a sectional view of another display substrate according to an embodiment of the present disclosure.

In an exemplary embodiment, reference is made to FIG. 3, which is a sectional view of another display substrate 0 according to an embodiment of the present disclosure. FIG. 3 may be a sectional view of a part a-a on the display substrate shown in FIG. 1. Referring to FIG. 3, the pixel unit further includes an active layer 04 and a source/drain pattern 05, which are disposed in two different layers. The storage capacitor 02 includes a first plate 021 and a second plate 022. The first plate 021 includes a first sub-plate 0211 and a second sub-plate 0212 that are electrically connected. The first sub-plate 0211 is disposed between the base substrate 01 and the active layer 04. The second sub-plate 0212 and the source/drain pattern 05 are disposed in the same layer. The second sub-plate 022 and the active layer 04 are disposed in the same layer. Optionally, an insulating layer is arranged between the first sub-plate 0211 and the second sub-plate 0212. The insulating layer is provided with a connection hole. The second sub-plate 0212 is electrically connected to the first sub-plate 0211 by the connection hole. As shown in FIG. 3, the pixel unit P further includes a TFT G and a light shielding layer 03, wherein the light shielding layer 03 and the first sub-plate 0211 of the storage capacitor 02 are disposed in the same layer. An orthographic projection of the active layer 04 on the base substrate 01 is within an orthographic projection of the light shielding layer 03 on the base substrate 01. The light shielding layer 03, the active layer 04, and the source/drain pattern 05 are disposed in three different layers. The light shielding layer 03 may shield the active layer 04, thereby preventing the switching characteristic of the TFT G from being affected by irradiating external light from the display substrate 0 to the active layer 04.

The light shielding layer 03 may be of a single-layer structure or a multi-layer structure. Optionally, the light shielding layer 03 includes a transparent conductive thin film and a light-shielding conductive thin film which are superimposed in a direction going distally from the base substrate 01. A material of the transparent conductive thin film may be ITO. The light-shielding conductive thin film may include a first light-shielding thin film and a second light-shielding thin film which are superimposed. A material of any one of the first light-shielding thin film and the second light-shielding thin film may be an alloy material of one or more of aluminum (Al), molybdenum (Mo), or copper (Cu). In addition, the material of the first light-shielding thin film and the material of the second light-shielding thin film may be the same or different. For example, the material of the first light-shielding thin film is Mo, and the material of the second light-shielding thin film is Al. The material of the active layer 04 may be amorphous silicon (a-Si), polysilicon (p-Si), IGZO, or ITZO. The source/drain pattern 05 may be of a single-layer structure or a multi-layer structure. Optionally, the source/drain pattern 05 includes a transparent conductive thin film and a light-shielding conductive thin film which are superimposed in a direction going distally from the base substrate 01. A material of the transparent conductive thin film may be ITO. The light-shielding conductive thin film may include a first light-shielding thin film and a second light-shielding thin film which are superimposed. A material of any one of the first light-shielding thin film and the second light-shielding thin film may be an alloy material of one or more of niobium (Nb), Mo, or Cu. In addition, the material of the first light-shielding thin film and the material of the second light-shielding thin film may be the same or different. For example, the material of the first light-shielding thin film is a MoNb alloy, and the material of the second light-shielding thin film is Cu.

Optionally, continuously referring to FIG. 3, the pixel unit P further includes a buffer layer 06, a gate insulating layer 07, a gate 08, and an interlayer dielectric layer 09. The buffer layer 06 is disposed between the first sub-plate 0211 and the active layer 04. The active layer 04, the gate insulating layer 07, the gate 08, the interlayer dielectric layer 09, and the source/drain pattern 05 constitute the TFT G. The buffer layer 06 and the interlayer dielectric layer 09 are disposed between the first sub-plate 0211 and the second sub-plate 0212. The buffer layer 06 and the interlayer dielectric layer 09 are provided with a through hole, respectively. The through hole in the buffer layer 06 and the through hole in the interlayer dielectric layer 09 are communicated to form a connection hole, and the second sub-plate 0212 is electrically connected to the first sub-plate 0211 by this connection hole. Optionally, the active layer 04, the interlayer dielectric layer 09, and the source/drain pattern 05 are disposed in a direction going distally from the base substrate 01. The source/drain pattern 05 includes a source 051 and a drain 052. The interlayer dielectric layer 09 is provided with a source via hole and a drain via hole (not shown in FIG. 3). The source 051 is in contact with the active layer 04 by the source via hole, and the drain 052 is in contact with the active layer 04 by the drain via hole.

In the embodiment of the present disclosure, when the TFT in the pixel unit P is a bottom-gate type TFT, the gate and the gate insulating layer are disposed between the active layer and the base substrate in a direction going distally from the base substrate. When the TFT in the pixel unit P is a top-gate type TFT, the gate insulating layer and the gate are disposed between the active layer and the interlayer dielectric layer in a direction going distally from the base substrate. In the embodiment of the present disclosure, the TFT in the pixel unit P is described by taking the top-gate type TFT as an example. As shown in FIG. 3, the gate insulating layer 07 and the gate 08 are disposed between the active layer 04 and the interlayer dielectric layer 09 in a direction going distally from the base substrate 01, and an orthographic projection of the gate insulating layer 07 on the base substrate 01 is coincident with an orthographic projection of the gate 08 on the base substrate 01.

The material of the buffer layer 06, the material of the gate insulating layer 07, and the material of the interlayer dielectric layer 09 may be one or a combination of more of silicon oxide (SiOx), silicon nitride (SiNx), or silicon oxynitride (SiOxNx). The gate 08 may be of a single-layer structure or a multi-layer structure. For example, the gate 08 may include a first film layer and a second film layer which are superimposed in a direction going distally from the gate insulating layer 07, wherein a material of the first film layer may be Cu, and a material of the second film layer may be a MoNb alloy.

Figure 4:
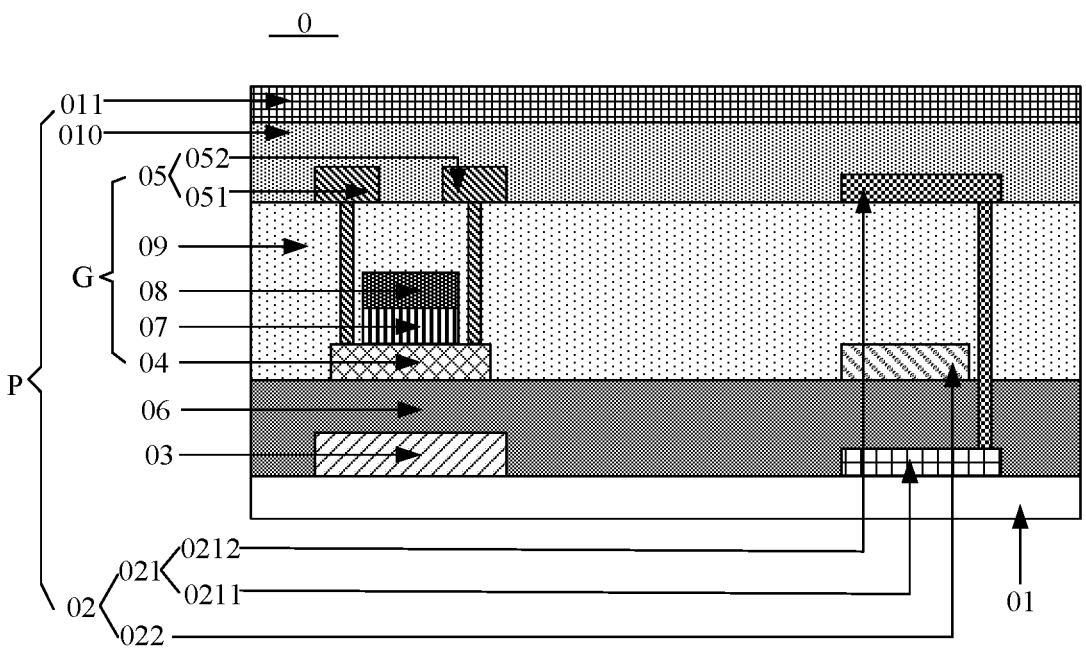
FIG. 4 is a sectional view of yet another display substrate according to an embodiment of the present disclosure.

Optionally, in the embodiment of the present disclosure, in addition to the structure shown in FIG. 3, the display substrate may also include other structures. In an exemplary embodiment, reference is made to FIG. 4, which is a schematic structural diagram of yet another display substrate 0 according to an embodiment of the present disclosure. FIG. 4 may be a sectional view of a part a-a on the display substrate shown in FIG. 1. Referring to FIG. 4, based on FIG. 3, the pixel unit P further includes a passivating layer 010 and a pixel electrode 011. The passivating layer 010 is disposed on a side of the source/drain pattern 05 distal from the base substrate 01, and provided with a pixel via hole (not shown in FIG. 4). The pixel electrode 011 is disposed on a side of the passivating layer 010 distal from the base substrate 01, and electrically connected to the drain 052 by the pixel via hole in the passivating layer 010. A material of the passivating layer 010 may be one or a combination of more of SiOx, SiNx, or SiOxNx, and a material of the pixel electrode 011 may be one or a combination of more of ITO, IZO, or ZnO:Al.

It is easily understood by a person skilled in the art that the display substrate described in the embodiment of the present disclosure is only exemplary. In practice, the display substrate may include more or less structures than the display substrate described in the present disclosure. For example, the display substrate may also include a common electrode, and when the display substrate is an electroluminescent display substrate, the pixel electrode may be referred to as an anode, and the common electrode may be referred to as a cathode. The display substrate may also include a structure such as an electroluminescent layer disposed between the anode and the cathode, which will not be repeated in the embodiment of the present disclosure.

In summary, according to the display substrate according to the embodiment of the present disclosure, since the pixel unit in the display substrate includes the storage capacitor and the plate of the storage capacitor is a transparent plate, the storage capacitor is capable of transmitting light, such that the area of a non-opaque region of the pixel unit is relatively large, and an aperture ratio of the display substrate is relatively high.

The display substrate according to the embodiment of the present disclosure may be applicable to the following method. For details about a method and principle for manufacturing the display substrate in the embodiment of the present disclosure, reference may be made to the descriptions in the following embodiments.

Figure 5:
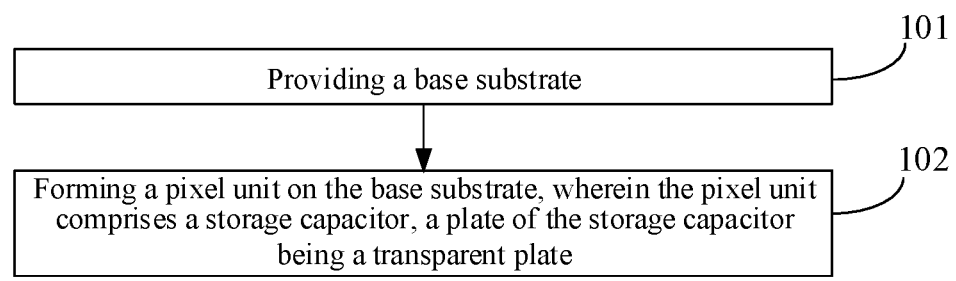
FIG. 5 is a flowchart of a method for manufacturing a display substrate according to an embodiment of the present disclosure.

Reference is made to FIG. 5, which shows a flowchart of a method for manufacturing a display substrate according to an embodiment of the present disclosure. This method may be used to manufacture the display substrate 0 shown in any one of FIGS. 1 to 4. Referring to FIG. 5, the method may include the following steps.

In step 101, a base substrate is provided.

In step 102, a pixel unit is formed on the base substrate, wherein the pixel unit includes a storage capacitor, a plate of the storage capacitor being a transparent plate.

In summary, according to the display substrate manufactured by the method according to the embodiment of the present disclosure, since the pixel unit includes the storage capacitor and the plate of the storage capacitor is a transparent plate, the storage capacitor is capable of transmitting light, such that the area of a non-opaque region of the pixel unit is relatively large, and an aperture ratio of the display substrate is relatively high.

Figure 6:
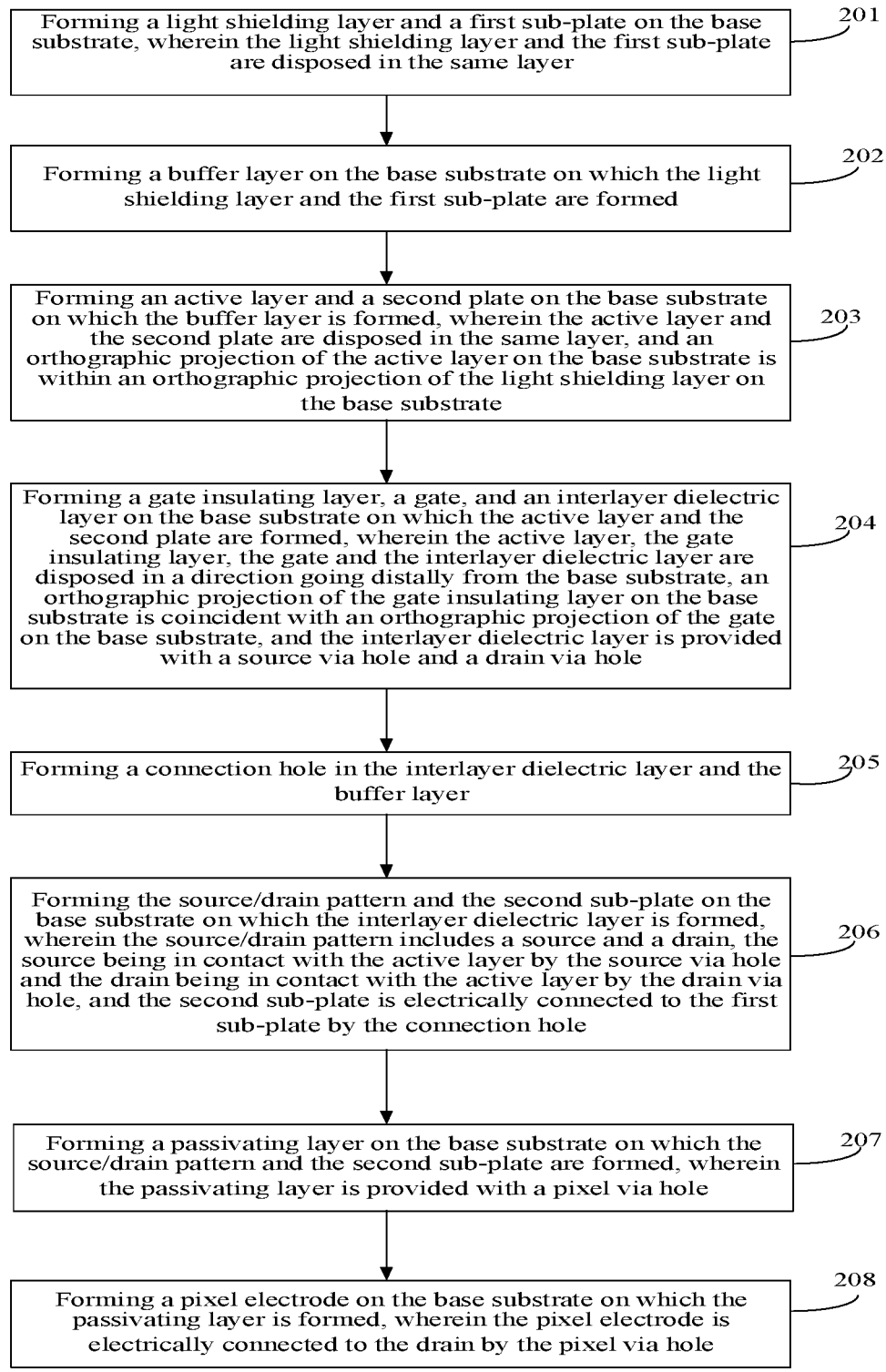
FIG. 6 is a flowchart of another method for manufacturing a display substrate according to an embodiment of the present disclosure.

Reference is made to FIG. 6, which shows a flowchart of a method for manufacturing another display substrate according to an embodiment of the present disclosure. This method may be used to manufacture the display substrate 0 shown in any one of FIGS. 1 to 4. This embodiment is described by taking the manufacture of the display substrate 0 shown in FIG. 4 as an example. Referring to FIG. 6, the method may include the following steps.

In step 201, a light shielding layer and a first sub-plate are formed on the base substrate, wherein the light shielding layer and the first sub-plate are disposed in the same layer.

Figure 7:
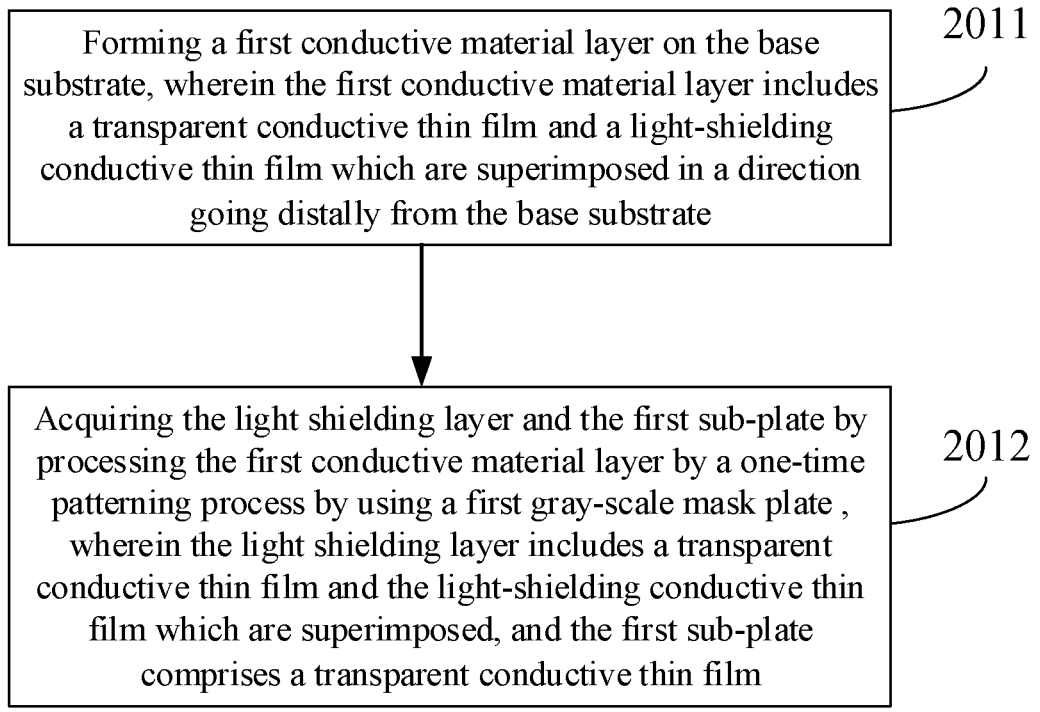
FIG. 7 is a flowchart of forming a light shielding layer and a first sub-plate on a base substrate according to an embodiment of the present disclosure.

In this embodiment of the present disclosure, the light shielding layer and the first sub-plate may be formed by a one-time process. Optionally, reference is made to FIG. 7, which is a flowchart of forming a light shielding layer and a first sub-plate on a base substrate according to an embodiment of the present disclosure. Referring to FIG. 7, the method may include the following sub-steps.

In sub-step 2011, a first conductive material layer is formed on the base substrate, wherein the first conductive material layer includes a transparent conductive thin film and a light-shielding conductive thin film which are superimposed in a direction going distally from the base substrate.

Figure 8:
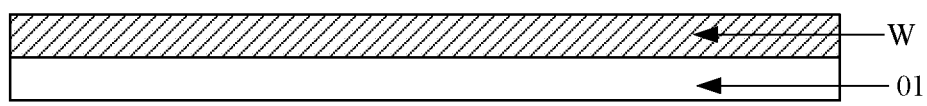
FIG. 8 is a schematic view of a first conductive material layer formed on the base substrate according to an embodiment of the present disclosure.

In an exemplary embodiment, reference is made to FIG. 8, which illustrates a first conductive material layer W formed on the base substrate 01 according to an embodiment of the present disclosure. The first conductive material layer W may include a transparent conductive thin film (not shown in FIG. 8) and a light-shielding conductive thin film (not shown in FIG. 8) which are superimposed in a direction going distally from the base substrate 01. Both the transparent conductive thin film and the light-shielding conductive thin film may be of a single-layer structure or a multi-layer structure. Optionally, the transparent conductive thin film is of a single-layer structure, and a material of the transparent conductive thin film is ITO. The light-shielding conductive thin film includes a first light-shielding thin film (not shown in FIG. 8) and a second light-shielding thin film (not shown in FIG. 8) which are superimposed in a direction going distally from the base substrate 01. A material of the first light-shielding thin film is Al, and a material of the second light-shielding thin film is Mo. In an exemplary embodiment, the first conductive material layer W may be acquired by sequentially depositing ITO, Al, and Mo on the base substrate 01.

In sub-step 2012, the light shielding layer and the first sub-plate are acquired by processing the first conductive material layer by a one-time patterning process by using a first gray-scale mask plate, wherein the light shielding layer includes a transparent conductive thin film and a light-shielding conductive thin film which are superimposed, and the first sub-plate includes the transparent conductive thin film.

Figure 9:
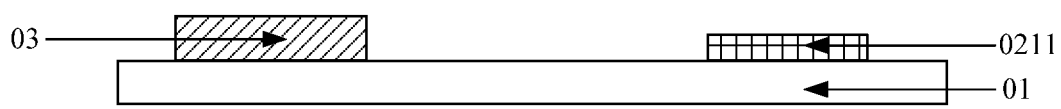
FIG. 9 is a schematic view of the first conductive material layer processed according to an embodiment of the present disclosure.

In an exemplary embodiment, reference is made to FIG. 9, which illustrates the first conductive material layer W processed according to an embodiment of the present disclosure, wherein the light shielding layer 03 and the first sub-plate 0211 are disposed in the same layer. The light shielding layer 03 may include a transparent conductive thin film and a light-shielding conductive thin film which are superimposed. The first sub-plate 0211 may include a transparent conductive thin film.

In the embodiment of the present disclosure, the light shielding layer 03 and the first sub-plate 0211 may be acquired by processing the first conductive material layer W by a one-time patterning process by using a first gray-scale mask plate. Optionally, firstly, a photoresist layer is formed on the first conductive material layer W. Then, the photoresist layer is sequentially exposed and developed by using the first gray-scale mask plate to acquire a photoresist pattern, wherein the photoresist pattern includes a first photoresist region, a second photoresist region, and a photoresist fully-unreserved region, the first photoresist region having a thickness greater than a thickness of the second photoresist region. Next, a region on the first conductive material layer W corresponding to the photoresist fully-unreserved region is etched, so as to remove the light-shielding conductive thin film and the transparent conductive thin film in the region on the first conductive material layer W corresponding to the photoresist fully-unreserved region. After that, photoresist in the second photoresist region is removed, and an region on the first conductive material layer W corresponding to the second photoresist region is etched, so as to remove a light-shielding conductive thin film in the region on the first conductive material layer W corresponding to the second photoresist region, and reserve a transparent conductive thin film in the region on the first conductive material layer W corresponding to the second photoresist region, wherein the transparent conductive thin film in the region on the first conductive material layer W corresponding to the second photoresist region is the first sub-plate 0211. Finally, the photoresist in the first photoresist region is removed, wherein the light-shielding conductive thin film and the transparent conductive thin film in a region on the first conductive material layer W corresponding to the first photoresist region are superimposed to form the light-shielding layer 03.

In step 202, a buffer layer is formed on the base substrate on which the light shielding layer and the sub-plate are formed.

Figure 10:
FIG. 10 is a schematic view of a buffer layer formed on the base substrate on which the light shielding layer and the first sub-plate are formed according to an embodiment of the present disclosure.

In an exemplary embodiment, reference is made to FIG. 10, which illustrates a buffer layer 06 formed on the base substrate 01 on which the light shielding layer 03 and the first sub-plate 0211 are formed according to an embodiment of the present disclosure. As shown in FIG. 10, the buffer layer 06 covers the light shielding layer 03 and the first sub-plate 0211.

A material of the buffer layer 06 may be one or a combination of more of SiOx, SiNx, or SiOxNx. In an exemplary embodiment, the buffer layer 06 is formed on the base substrate 01 on which the light shielding layer 03 and the first sub-plate 0211 are formed, by any process such as deposition, coating, or sputtering.

In 203, an active layer and a second plate are formed on the base substrate on which the buffer layer is formed, wherein the active layer and the second plate are disposed in the same layer, and an orthographic projection of the active layer on the base substrate is within an orthographic projection of the light shielding layer on the base substrate.

Figure 11:
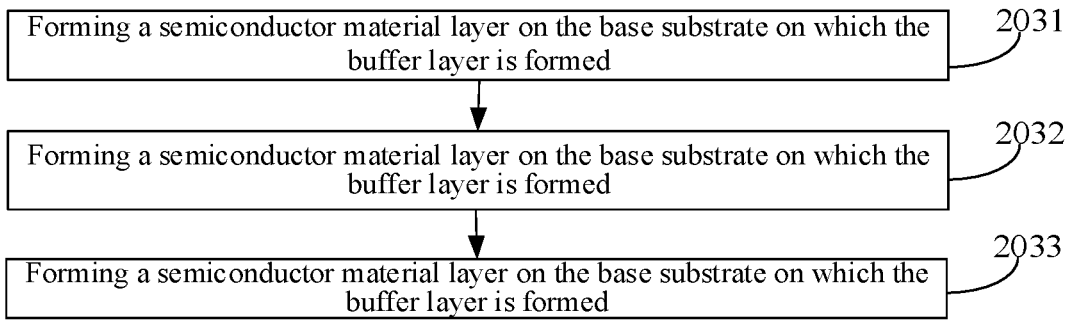
FIG. 11 is a flowchart of forming an active layer and a second plate on the base substrate on which the buffer layer is formed according to an embodiment of the present disclosure.

In this embodiment of the present disclosure, the active layer and the second plate may be formed by a one-time process. Reference is made to FIG. 11, which is a flowchart of forming the active layer and the second plate on the base substrate on which the buffer layer is formed according to an embodiment of the present disclosure. Referring to FIG. 11, the method may include the following sub-steps.

In sub-step 2031, a semiconductor material layer is formed on the base substrate on which the buffer layer is formed.

Figure 12:
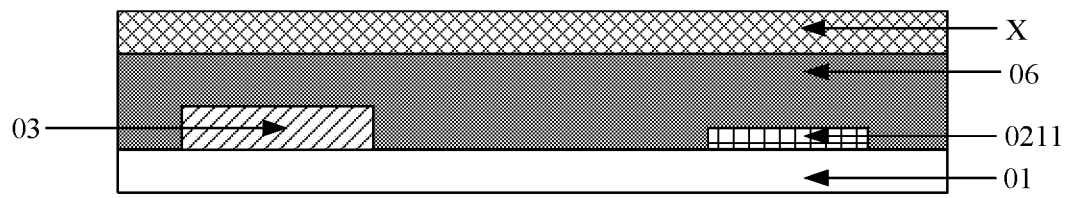
FIG. 12 is a schematic view of a semiconductor material layer formed on the base substrate on which the buffer layer is formed according to an embodiment of the present disclosure.

Reference is made to FIG. 12, which illustrates a semiconductor material layer X formed on the base substrate 01 on which the buffer layer 06 is formed according to an embodiment of the present disclosure. A material of the semiconductor material layer X may be IGZO or ITZO. In an exemplary embodiment, the semiconductor material layer X is formed from IGZO on the base substrate 01 on which the buffer layer 06 is formed, by any process such as deposition, coating, or sputtering.

In sub-step 2032, the active layer and a semiconductor plate are acquired by processing the semiconductor material layer by a one-time patterning process.

Figure 13:
FIG. 13 is a schematic view of the semiconductor material layer processed by a one-time patterning process according to an embodiment of the present disclosure.

In an exemplary embodiment, reference is made to FIG. 13, which illustrates the semiconductor material layer X processed by a one-time patterning process according to an embodiment of the present disclosure. As shown in FIG. 13, the active layer 04 and the semiconductor plate T are disposed in the same layer, and an orthographic projection of the active layer 04 on the base substrate 01 is within an orthographic projection of the light shielding layer 03 on the base substrate 01.

In sub-step 2033, the second plate is acquired by performing a conductivity development treatment on the semiconductor plate.

Figure 14:
FIG. 14 is a schematic view of a semiconductor plate subjected to a conductivity development treatment according to an embodiment of the present disclosure.

In an exemplary embodiment, reference is made to FIG. 14, which illustrates the semiconductor plate T subjected to the conductivity development treatment according to an embodiment of the present disclosure, wherein a second plate 022 is acquired by performing the conductivity development treatment on the semiconductor plate T, and the second plate 022 and the active layer 04 are disposed in the same layer. Optionally, the semiconductor plate T may be subjected to the conductivity development treatment by a doping process.

In step 204, a gate insulating layer, a gate, and an interlayer dielectric layer are formed on the base substrate on which the active layer and the second plate are formed, wherein the active layer, the gate insulating layer, the gate and the interlayer dielectric layer are disposed in a direction going distally from the base substrate, an orthographic projection of the gate insulating layer on the base substrate is coincident with an orthographic projection of the gate on the base substrate, and the interlayer dielectric layer is provided with a source via hole and a drain via hole.

Figure 15:
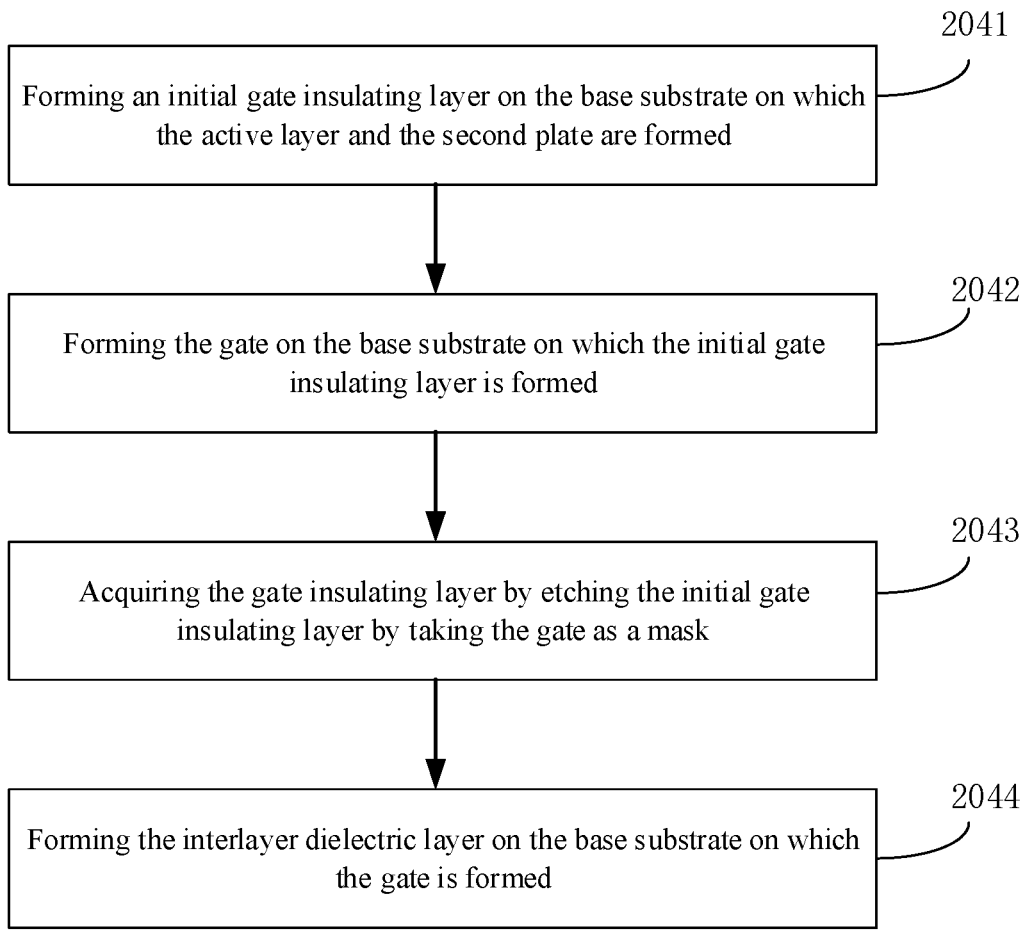
FIG. 15 is a flowchart of forming a gate insulating layer, a gate, and an interlayer dielectric layer on the base substrate on which the active layer and the second plate are formed according to an embodiment of the present disclosure.

Optionally, reference is made to FIG. 15, which is a flowchart of forming the gate insulating layer, the gate, and the interlayer dielectric layer on the base substrate on which the active layer and the second plate are formed according to an embodiment of the present disclosure. Referring to FIG. 15, the method may include the following sub-steps.

In sub-step 2041, an initial gate insulating layer is formed on the base substrate on which the active layer and the second plate are formed.

Figure 16:
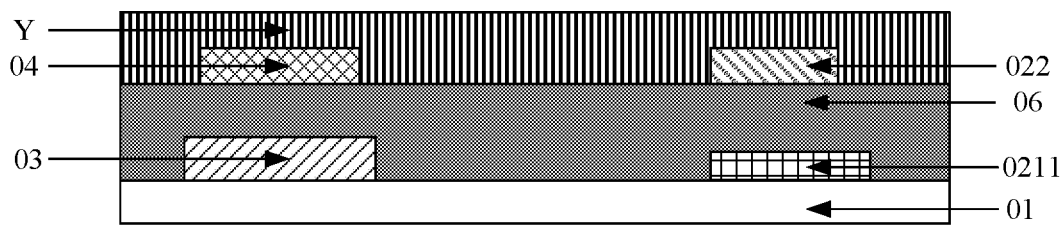
FIG. 16 is a schematic diagram of an initial gate insulating layer formed on the base substrate on which the active layer and the second plate are formed according to an embodiment of the present disclosure.

In an exemplary embodiment, reference is made to FIG. 16, which illustrates an initial gate insulating layer Y formed on the base substrate 01 on which the active layer 04 and the second plate 022 are formed according to an embodiment of the present disclosure, wherein the initial gate insulating layer Y is covered with the active layer 04 and the second plate 022. A material of the initial gate insulating layer 06 may be one or a combination of more of SiOx, SiNx, or SiOxNx. In an exemplary embodiment, the initial gate insulating layer Y is formed from SiOx on the base substrate 01 on which the active layer 04 and the second plate 022 are formed, by any process such as deposition, coating, or sputtering.

In sub-step 2042, the gate is formed on the base substrate on which the initial gate insulating layer is formed.

Figure 17:
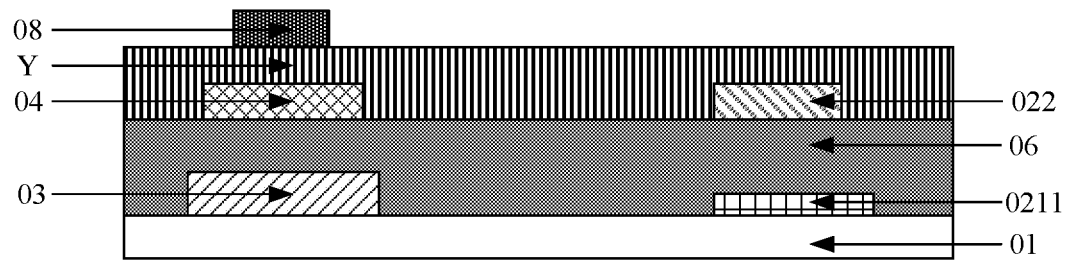
FIG. 17 is a schematic view of the gate formed on the base substrate on which the initial gate insulating layer is formed according to an embodiment of the present disclosure.

In an exemplary embodiment, reference is made to FIG. 17, which illustrates the gate 08 formed on the base substrate 01 on which the initial gate insulating layer Y is formed according to an embodiment of the present disclosure. An orthographic projection of the gate 08 on the base substrate 01 is within an orthographic projection of the active layer 04 on the base substrate 01. Optionally, the gate 08 may be of a single-layer structure or a multi-layer structure. For example, the gate 08 may include a first film layer and a second film layer which are superimposed in a direction going distally from the initial gate insulating layer Y, wherein a material of the first film layer may be Cu, and a material of the second film layer may be a MoNb alloy. In an exemplary embodiment, a gate material layer may be acquired by sequentially depositing Cu and MoNb alloy on the initial gate insulating layer Y, and the gate 08 may be acquired by processing the gate material layer by a one-time patterning process.

In sub-step 2043, the gate insulating layer is acquired by etching the initial gate insulating layer by taking the gate as a mask.

Figure 18:
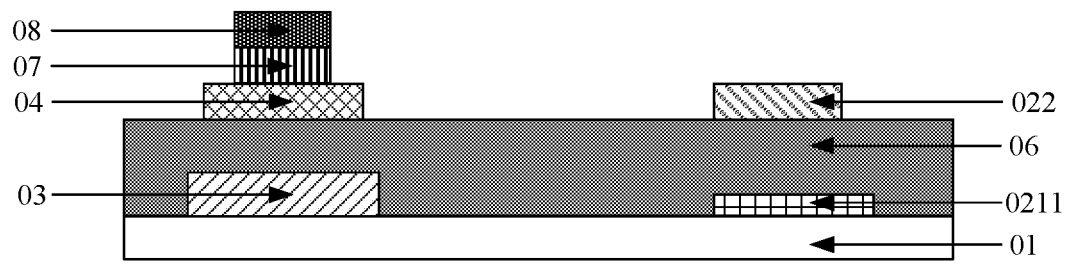
FIG. 18 is a schematic view of the initial gate insulating layer etched according to an embodiment of the present disclosure.

In an exemplary embodiment, reference is made to FIG. 18, which illustrates the initial gate insulating layer Y etched according to an embodiment of the present disclosure. The gate insulating layer 07 may be acquired by etching the initial gate insulating layer Y by taking the gate 08 as a mask. As shown in FIG. 18, an orthographic projection of the gate insulating layer 07 on the base substrate 01 is coincident with an orthographic projection of the gate 08 on the base substrate 01.

In sub-step 2044, an interlayer dielectric layer is formed on the base substrate on which the gate is formed.

Figure 19:
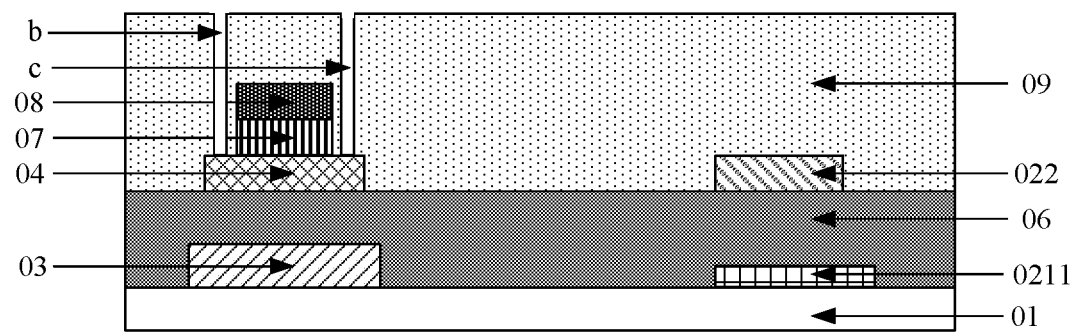
FIG. 19 is a schematic view after an interlayer dielectric layer is formed on the base substrate on which the gate is formed according to an embodiment of the present disclosure.

In an exemplary embodiment, reference is made to FIG. 19, which illustrates the interlayer dielectric layer 09 formed on the base substrate 01 on which the gate 08 is formed according to an embodiment of the present disclosure. As shown in FIG. 19, the interlayer dielectric layer 09 is provided with a source via hole b and a drain via hole c. A material of the interlayer dielectric layer 09 may be one or a combination of more of SiOx, SiNx, or SiOxNx. In an exemplary embodiment, a SiOx material layer may be formed on the base substrate 01 on which the gate 08 is formed, by any of the processes such as deposition, coating, or sputtering. The source via hole b and the drain via hole c are formed in the SiOx material layer by processing the SiOx material layer by a one-time patterning process.

In step 205, a connection hole is formed in the interlayer dielectric layer and the buffer layer.

Figure 20:
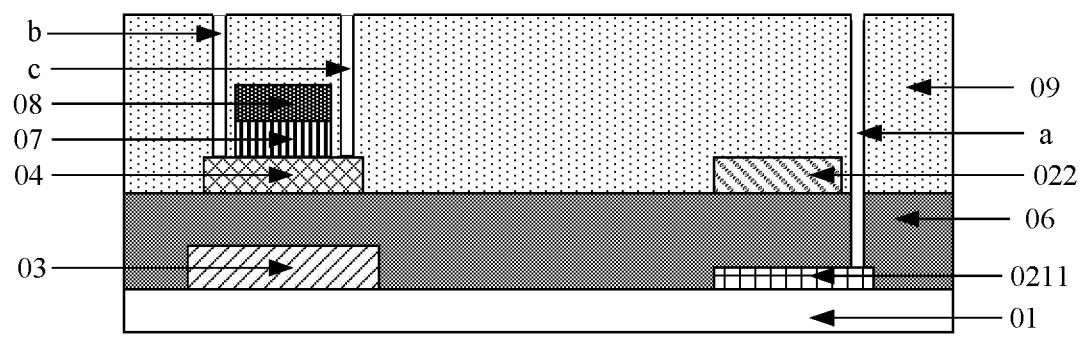
FIG. 20 is a schematic view of a connection hole formed in the interlayer dielectric layer and the buffer layer according to an embodiment of the present disclosure.

In an exemplary embodiment, reference is made to FIG. 20, which illustrates a connection hole a formed in the interlayer dielectric layer 09 and the buffer layer 06 according to an embodiment of the present disclosure. As shown in FIG. 20, the connection hole a penetrate the interlayer dielectric layer 09 and the buffer layer 06, and the first sub-plate 0211 is partially exposed by the connection hole a. Optionally, the connection hole a may be formed in the interlayer dielectric layer 09 and the buffer layer 06 by a one-time patterning process.

In step 206, a source/drain pattern and a second sub-plate are formed on the base substrate on which the interlayer dielectric layer is formed, wherein the source/drain pattern includes a source and a drain. The source is in contact with the active layer by the source via hole, the drain is in contact with the active layer by the drain via hole, and the second sub-plate is electrically connected to the first sub-plate by the connection hole.

Figure 21:
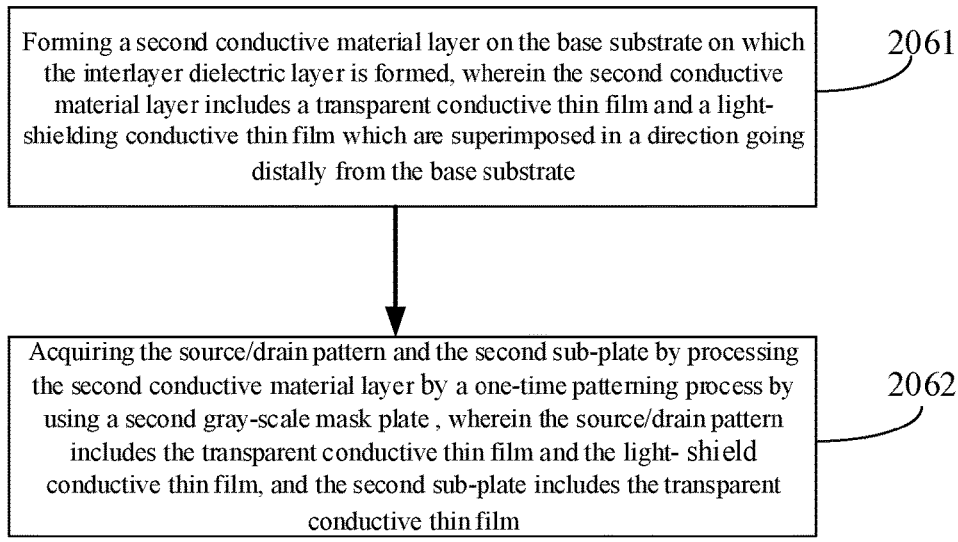
FIG. 21 is a flowchart of forming a source/drain pattern and a second sub-plate on the base substrate on which the interlayer dielectric layer is formed according to an embodiment of the present disclosure.

In this embodiment of the present disclosure, the source/drain pattern and the second sub-plate may be formed by a one-time process. Optionally, reference is made to FIG. 21, which is a flowchart of forming the source/drain pattern and the second sub-plate on the base substrate on which the interlayer dielectric layer is formed according to an embodiment of the present disclosure. Referring to FIG. 21, the method may include the following steps.

In sub-step 2061, a second conductive material layer is formed on the base substrate on which the interlayer dielectric layer is formed, wherein the second conductive material layer includes a transparent conductive thin film and a light-shielding conductive thin film which are superimposed in a direction going distally from the base substrate.

Figure 22:
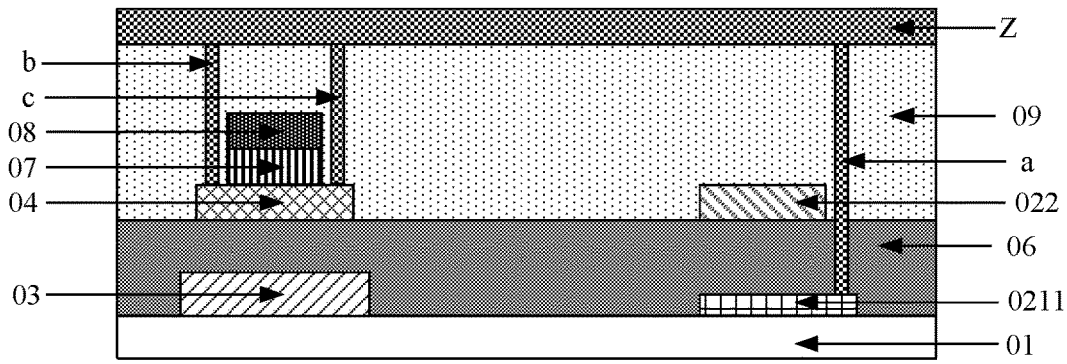
FIG. 22 is a schematic view of a second conductive material layer formed on the base substrate on which the interlayer dielectric layer is formed according to an embodiment of the present disclosure.

In an exemplary embodiment, reference is made to FIG. 22, which illustrates a second conductive material layer Z formed on the base substrate 01 on which the interlayer dielectric layer 09 is formed according to an embodiment of the present disclosure. The second conductive material layer Z may include a transparent conductive thin film (not shown in FIG. 22) and a light-shielding conductive thin film (not shown in FIG. 22) which are superimposed in a direction going distally from the base substrate 01. The transparent conductive thin film and the light-shielding conductive thin film may be of a single-layer structure or a multi-layer structure, respectively. Optionally, the transparent conductive thin film is of a single-layer structure, and a material of the transparent conductive thin film is one or a combination of more of ITO, IZO, or ZnO:Al. The light-shielding conductive thin film includes a first light-shielding thin film (not shown in FIG. 22) and a second light-shielding thin film (not shown in FIG. 22) which are superimposed in a direction going distally from the base substrate 01. A material of the first light-shielding thin film is a MoNb alloy, and a material of the second light-shielding thin film is Cu. In an exemplary embodiment, the second conductive material layer Z may be acquired by sequentially depositing ITO, MoNb alloy, and Mo on the base substrate 01 on which the interlayer dielectric layer 09 is formed.

In sub-step 2062, the source/drain pattern and the second sub-plate are acquired by processing the second conductive material layer by a one-time patterning process by using a second gray-scale mask plate, wherein the source/drain pattern includes the transparent conductive thin film and the light-shielding conductive thin film which are superimposed, and the second sub-plate includes the transparent conductive thin film.

FIG. 3 illustrates the second conductive material layer Z processed by a one-time patterning process. The source/drain pattern 05 and the second sub-plate 0212 may be acquired by processing the second conductive material layer Z by a one-time patterning process. The source/drain pattern 05 and the second sub-plate 0212 are disposed in the same layer. The source/drain pattern 05 includes a source 051 and a drain 052, wherein the source 051 is in contact with the active layer 04 by the source via hole (not shown in FIG. 3), and the drain 052 is in contact with the active layer 04 by the drain via hole (not shown in FIG. 3). The second sub-plate 0212 is electrically connected to the first sub-plate 0211 by the connection hole (not shown in FIG. 3). The source/drain pattern 05 includes a transparent conductive thin film and a light-shielding conductive thin film which are superimposed. The second sub-plate 0212 includes a transparent conductive thin film.

In the embodiment of the present disclosure, the source/drain pattern 05 and the second sub-plate 0212 may be acquired by processing the second conductive material layer Z by a one-time patterning process by using a second gray-scale mask plate. Optionally, firstly, a photoresist layer is formed on the second conductive material layer Z. Then, the photoresist layer is sequentially exposed and developed by using the second gray-scale mask plate to acquire a photoresist pattern, wherein the photoresist pattern includes a first photoresist region, a second photoresist region, and a photoresist fully-unreserved region, the first photoresist region having a thickness greater than a thickness of the second photoresist region. Next, a region on the second conductive material layer Z corresponding to the photoresist fully-unreserved region, is etched, so as to remove the light-shielding conductive thin film and the transparent conductive thin film in the region on the second conductive material layer Z corresponding to the photoresist fully-unreserved region. After that, photoresist in the second photoresist region is removed, and an region on the second conductive material layer Z corresponding to the second photoresist region is etched, so as to remove the light-shielding conductive thin film in the region on the second conductive material layer Z corresponding to the second photoresist region, wherein the transparent conductive thin film in the region on the second conductive material layer Z corresponding to the second photoresist region is the second sub-plate 0212. Finally, the photoresist in the first photoresist region is removed, wherein the light-shielding conductive thin film and the transparent conductive thin film in a region on the second conductive material layer Z corresponding to the first photoresist region are superimposed to form the source/drain pattern 05.

It should be noted that the embodiment of the present disclosure is described by taking the source/drain pattern 05 including a transparent conductive thin film and a light-shielding conductive thin film which are superimposed as an example. The source/drain pattern 05 may also include a transparent conductive thin film only, such that the region where the source/drain pattern 05 is disposed is non-opaque, thereby increasing the area of the non-opaque region of the pixel unit. In addition, it is easy to understand that the display substrate may also include a data line. The data line is usually disposed in the same layer as the source/drain pattern 05, and may include a transparent conductive thin film and a light-shielding conductive thin film which are superimposed. When the source/drain pattern 05 and the second sub-plate 0212 include a transparent conductive thin film only, and the data line includes a transparent conductive thin film and a light-shielding conductive thin film which are superimposed, the source/drain pattern 05, the second sub-plate 0212, and the data line are acquired by processing the second conductive material layer by a one-time patterning process by using a second gray-scale mask plate. The detailed implementation process may refer to FIG. 21 and related descriptions, which is not repeated in the embodiments of the present disclosure.

In step 207, a passivating layer is formed on the base substrate on which the source/drain pattern and the second sub-plate are formed, wherein the passivating layer is provided with a pixel via hole.

Figure 23:
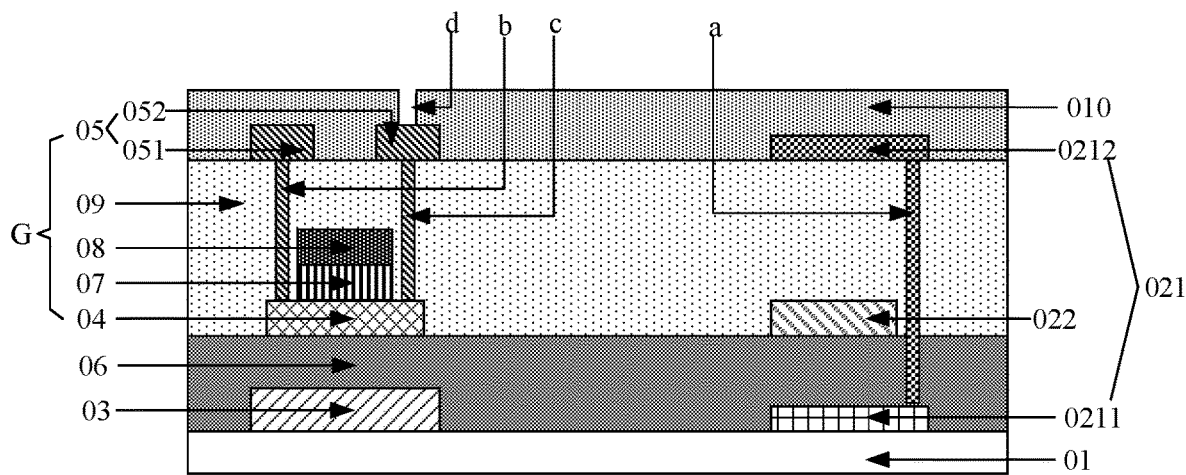
FIG. 23 is a schematic view of a passivating layer formed on the base substrate on which the source/drain pattern and the second sub-plate are formed according to an embodiment of the present disclosure.

In an exemplary embodiment, reference is made to FIG. 23, which illustrates a passivating layer 010 formed on the base substrate 01 on which the source/drain pattern 05 and the second sub-plate 0212 are formed according to an embodiment of the present disclosure. As shown in FIG. 23, the passivating layer 010 may be provided with a pixel via hole d. Optionally, a material of the passivating layer 010 may be one or a combination of more of SiOx, SiNx, or SiOxNx. In an exemplary embodiment, a SiOx material layer is formed on the base substrate 01 on which the source/drain pattern 05 and the second sub-plate 0212 are formed, by any process such as deposition, coating, or sputtering; and the pixel via hole d is formed in the SiOx material layer by processing the SiOx material layer by a one-time patterning process, thereby acquiring the passivating layer 010.

In step 208, a pixel electrode is formed on the base substrate on which the passivating layer is formed, wherein the pixel electrode is electrically connected to the drain by the pixel via hole.

FIG. 4 illustrates the pixel electrode 011 formed on the base substrate 01 on which the passivating layer 010 is formed. The pixel electrode 011 is electrically connected to the drain 052 by the pixel via hole (not shown in FIG. 4). In an exemplary embodiment, an ITO material layer is formed on the base substrate 01 on which the passivating layer 010 is formed, by any process such as deposition, coating, or sputtering; and the pixel electrode 011 is acquired by processing the ITO material layer by a one-time patterning process.

In summary, according to the display substrate manufactured by the method according to the embodiment of the present disclosure, since the pixel unit includes the storage capacitor and the plate of the storage capacitor is a transparent plate, the storage capacitor is capable of transmitting light, such that the area of a non-opaque region of the pixel unit is relatively large, and an aperture ratio of the display substrate is relatively high.

Figure 24:
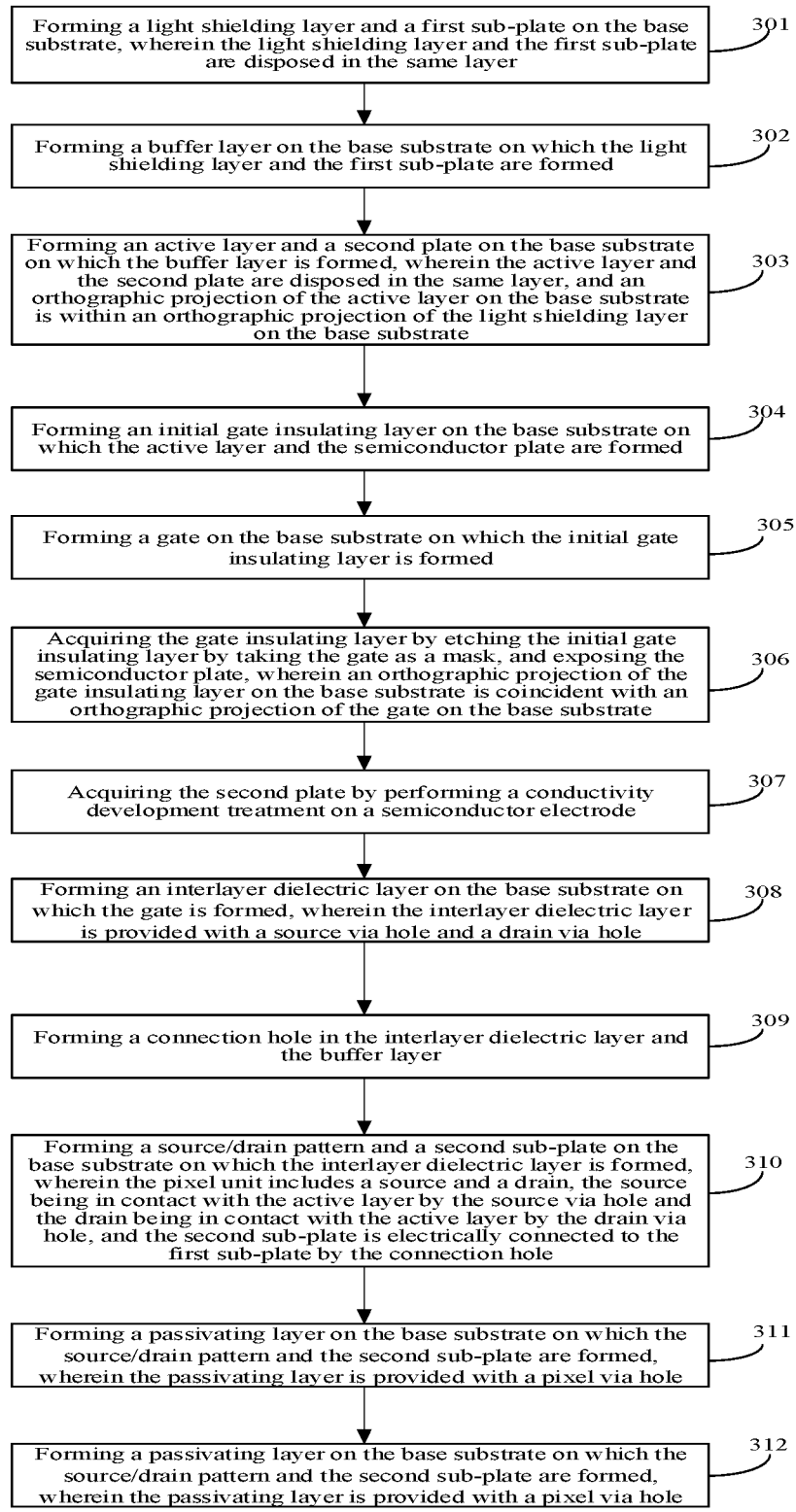
FIG. 24 is a flowchart of still another method for manufacturing a display substrate according to an embodiment of the present disclosure.

Reference may be made to FIG. 24, which shows a flowchart of another method for manufacturing a display substrate according to an embodiment of the present disclosure. This method may be applicable to manufacturing the display substrate 0 shown in any one of FIGS. 1 to 4. FIG. 24 is described by taking the manufacture of the display substrate 0 shown in FIG. 4 as an example. Referring to FIG. 24, the method may include the following steps.

In step 301, a light shielding layer and a first sub-plate are formed on the base substrate, wherein the light shielding layer and the first sub-plate are disposed in the same layer.

In step 302, a buffer layer is formed on the base substrate on which the light shielding layer and the sub-plate are formed.

The implementation processes of step 301 to step 302 may refer to the implementation processes of step 201 to step 202 in the embodiment shown in FIG. 6, and FIG. 7 to FIG. 10, which is not repeated in the embodiments of the present disclosure.

In step 303, an active layer and a semiconductor plate are formed on the base substrate on which the buffer layer is formed, wherein the active layer and the semiconductor plate are disposed in the same layer, and an orthographic projection of the active layer on the base substrate is within an orthographic projection of the light shielding layer on the base substrate.

The implementation process of step 303 may refer to the implementation processes of sub-step 2031 to sub-step 2032 in the embodiment shown in FIG. 6, and FIG. 12 to FIG. 13, which is not repeated in the embodiments of the present disclosure.

In step 304, an initial gate insulating layer is formed on the base substrate on which the active layer and the semiconductor plate are formed.

Figure 25:
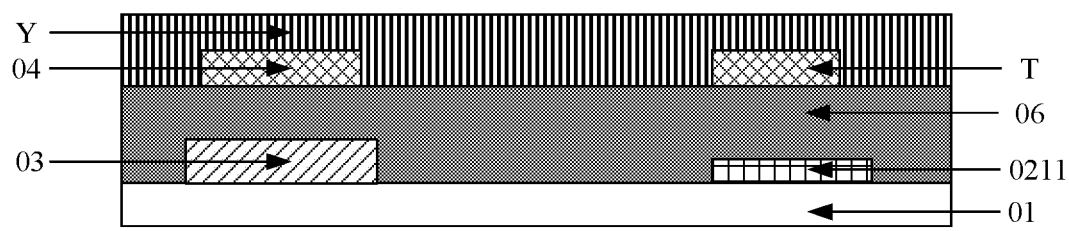
FIG. 25 is a schematic view of an initial gate insulating layer formed on the base substrate on which the active layer and the semiconductor plate are formed according to an embodiment of the present disclosure.

In an exemplary embodiment, reference is made to FIG. 25, which illustrates an initial gate insulating layer Y formed on the base substrate 01 on which the active layer 04 and the semiconductor plate T are formed according to an embodiment of the present disclosure. The initial gate insulating layer Y is covered with the active layer 04 and the semiconductor plate T. The implementation process of step 304 may refer to the implementation process of sub-step 2041 in the embodiment shown in FIG. 6, which is not repeated in the embodiments of the present disclosure.

In step 305, the gate is formed on the base substrate on which the initial gate insulating layer is formed.

Figure 26:
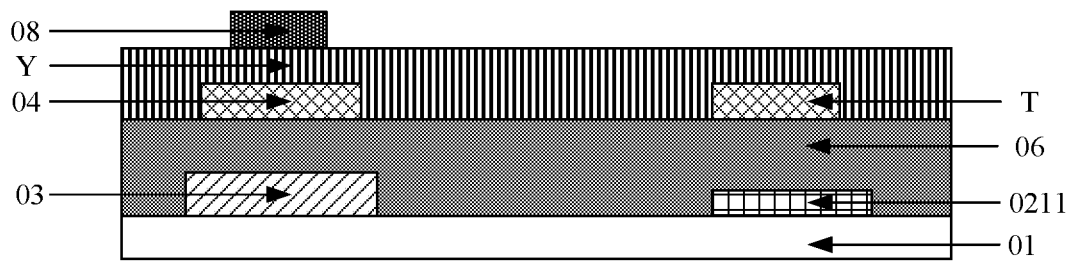
FIG. 26 is a schematic view of the gate formed on the base substrate on which the initial gate insulating layer is formed according to an embodiment of the present disclosure.

In an exemplary embodiment, reference is made to FIG. 26, which illustrates the gate 08 formed on the base substrate 01 on which the initial gate insulating layer Y is formed according to an embodiment of the present disclosure. The implementation process of step 305 may refer to the implementation process of sub-step 2042 in the embodiment shown in FIG. 6, which is not repeated in the embodiments of the present disclosure.

In step 306, the gate insulating layer is acquired by etching the initial gate insulating layer by taking the gate as a mask, and a semiconductor plate is exposed, wherein an orthographic projection of the gate insulating layer on the base substrate is coincident with an orthographic projection of the gate on the base substrate.

Figure 27:
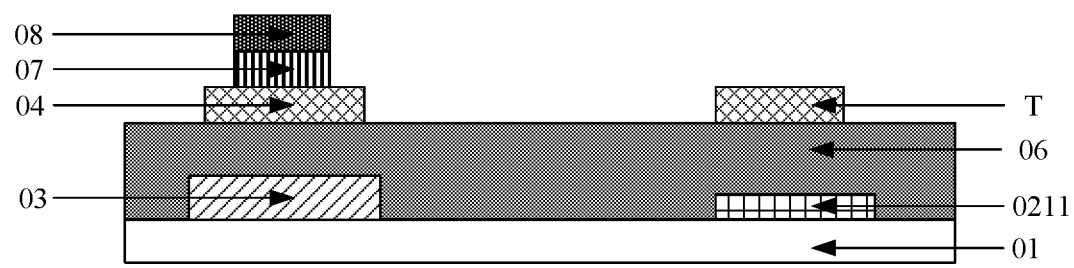
FIG. 27 is a schematic view of the initial gate insulating layer etched according to an embodiment of the present disclosure.

In an exemplary embodiment, reference is made to FIG. 27, which illustrates the initial gate insulating layer Y etched according to an embodiment of the present disclosure. The gate insulating layer 07 may be acquired by etching the initial gate insulating layer Y by taking the gate 08 as a mask, and the semiconductor plate T is exposed, wherein an orthographic projection of the gate insulating layer 07 on the base substrate 01 is coincident with an orthographic projection of the gate 08 on the base substrate 01.

In step 307, a second plate is acquired by performing a conductivity development treatment on the semiconductor plate.

FIG. 18 illustrates the semiconductor plate T subjected to the conductivity development treatment is shown in FIG. 18. The second plate 022 may be acquired by performing the conductivity development treatment on the semiconductor plate T, wherein the second plate 022 and the active layer 04 are disposed in the same layer. Optionally, the semiconductor plate T may be subjected to the conductivity development treatment by a doping process.

In step 308, an interlayer dielectric layer is formed on the base substrate on which the gate is formed, wherein the interlayer dielectric layer includes a source via hole and a drain via hole.

The implementation process of step 308 may refer to the implementation process of sub-step 2044 in the embodiment shown in FIG. 15, and FIG. 19, which is not repeated in the embodiments of the present disclosure.

In step 309, a connection hole is formed in the interlayer dielectric layer and the buffer layer.

In step 310, a source/drain pattern and a second sub-plate are formed on the base substrate on which the interlayer dielectric layer is formed, wherein the source/drain pattern includes a source and a drain. The source is in contact with the active layer by the source via hole, the drain is in contact with the active layer by the drain via hole, and the second sub-plate is electrically connected to the first sub-plate by the connection hole.

In step 311, a passivating layer is formed on the base substrate on which the source/drain pattern and the second sub-plate are formed, wherein the passivating layer is provided with a pixel via hole.

In step 312, a pixel electrode is formed on the base substrate on which the passivating layer is formed, wherein the pixel electrode is electrically connected to the drain by the pixel via hole.

For details about step 309 to step 312, reference may be made to step 205 to step 208 in the embodiment shown in FIG. 2, and FIG. 20 to FIG. 23, and FIG. 4, which are not repeated in the embodiments of the present disclosure.

In summary, in the display substrate manufactured by the method according to the embodiment of the present disclosure, since the pixel unit in the display substrate includes the storage capacitor and the plate of the storage capacitor is a transparent plate, the storage capacitor is capable of transmitting light, such that an area of a non-opaque region of the pixel unit is relatively large, and an aperture ratio of the display substrate is relatively high.

It should be pointed out that the one-time patterning process described in the embodiments of the present disclosure may include: photoresist coating, exposure, development, etching, and photoresist stripping. Therefore, processing a material layer (e.g., the semiconductor material layer X) by the one-time patterning process may include: first, forming a photoresist layer by coating a layer of photoresist on the material layer (e.g., the semiconductor material layer X); then, exposing the photoresist layer by using a mask plate, such that a completely exposed region and a non-exposed region are formed on the photoresist layer; next, processing the exposed photoresist layer by a development process, such that the photoresist in the completely exposed region is completely removed, and all the photoresist in the non-exposed region remains; after that, etching a region, corresponding to the completely exposed region, on the material layer (e.g., the semiconductor material layer X) by an etching process; and finally, stripping the photoresist in the non-exposed region, and forming corresponding structures (for example, the active layer 04 and the semiconductor plate T) on a region, corresponding to the non-exposed region, on the material layer (e.g., the semiconductor material layer X). It is easy to understand that the embodiment of the present disclosure is described by taking positive photoresist as an example. The photoresist used in one-time patterning process may be negative photoresist, which will not be repeated in the embodiments of the present disclosure. Moreover, it may be understood that the sequence of the steps in the method for manufacturing the display substrate according to the embodiment of the present disclosure may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

Based on the same inventive concept, an embodiment of the present disclosure also provides a display device. The display device includes the display substrate according to the above embodiment. The display device may be an electroluminescent display device, or may be a flexible display device. For example, the display device may be an organic light-emitting diode (OLED) display device or a quantum dot light-emitting diode (QLED) display device. In an exemplary embodiment, the display device may be any product or component having a display function, such as electronic paper, a mobile phone, a tablet computer, a television, a display, a laptop computer, a digital photo frame, a navigator, or a wearable device.

In the present disclosure, the terms "first" and "second" are used for descriptive purposes only and are not to be construed as indicating or implying relative importance. The term "at least one" is interpreted as one or more, and the term "a plurality of" is interpreted as two or more, unless otherwise specifically defined. The term "electrically connected" is interpreted as a connection capable of transferring charge, but not necessarily includes charge transfer. For example, if A is electrically connected to B, it indicates that A is connected to B and charges can be transferred between A and B, whereas the charge transfer does not necessarily occur between A and B.

In the present disclosure, the term "disposed in the same layer" is interpreted as a relationship between layers simultaneously formed in the same step. For example, in an example, when the second sub-plate 0212 and the source/drain pattern 05 are formed as a result of one or more steps of the same patterning process performed in the same material layer, they are disposed in the same layer, that is, disposed in the same layer. In another example, the second sub-plate 0212 and the source/drain pattern 05 may be formed in the same layer by simultaneously performing the steps of forming the second sub-plate 0212 and forming the source/drain pattern 05. The recitation "disposed in the same layer" does not always mean that the layer thickness or the layer height in the sectional view is the same. Similarly, the recitation "disposed in different layers" is interpreted as a relationship between layers that are not formed at the same time in different steps. For example, in one example, when the active layer 04 and the source/drain pattern 05 are formed as a result of one or more steps of different patterning processes performed in different material layers, they are disposed on different layers.

The foregoing descriptions are merely optional embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display substrate, comprising:
   a base substrate; and
   a pixel unit disposed on the base substrate, wherein the pixel unit comprises a storage capacitor, the storage capacitor comprises a first plate and a second plate facing each other, and a plate of the storage capacitor is a transparent plate;
   wherein the pixel unit further comprises a light shielding layer, an active layer and a source/drain pattern, the light shielding layer is between the base substrate and the active layer, an orthographic projection of the active layer on the base substrate is within an orthographic projection of the light shielding layer on the base substrate;
   the light shielding layer comprises a transparent conductive thin film and a light-shielding conductive thin film which are superimposed, the transparent conductive thin film in the light shielding layer is closer to a side of the base substrate and is in direct contact with the base substrate, and an insulating layer is provided between the light shielding layer and the source/drain pattern; and
   the first plate comprises a first sub-plate, the first sub-plate comprises a transparent conductive thin film, the transparent conductive thin film of the first sub-plate is in direct contact with the insulating layer.

2. The display substrate according to claim 1, wherein the transparent conductive thin film of the first sub-plate and the transparent conductive thin film of the light shielding layer are disposed in a same layer, and a thickness of the light shielding layer is bigger than that of the first sub-plate in a direction vertical to the base substrate.

3. The display substrate according to claim 1, wherein the display substrate further comprises a passivating layer, the passivating layer is at a side of the source/drain pattern farther away from the base substrate, the source/drain pattern comprises a transparent conductive thin film and a light-shielding conductive thin film which are superimposed, and the transparent conductive thin film superimposed in the source/drain pattern is closer to the side of the base substrate and is in direct contact with a side of the insulating layer farther away from the base substrate.

4. The display substrate according to claim 3, wherein the first plate comprises a second sub-plate, the second sub-plate and the transparent conductive thin film superimposed in the source/drain pattern are disposed in a same layer; and
   the second sub-plate comprises a transparent conductive thin film, the transparent conductive thin film of the second sub-plate is in direct contact with the passivating layer, and a thickness of the source/drain pattern is bigger than that of the second sub-plate in a direction vertical to the base substrate.

5. The display substrate according to claim 3, wherein the pixel unit further comprises a pixel electrode on a side of the passivating layer farther away from the base substrate, the passivating layer comprises a pixel via hole, the pixel electrode is electrically connected to the source/drain pattern by the pixel via hole, and an orthographic projection of the pixel via hole on the base substrate overlaps with an orthographic projection of the source/drain pattern on the base substrate.

6. The display substrate according to claim 3, wherein the insulating layer comprises a connection hole, the second sub-plate is electrically connected to the first sub-plate by the connection hole, and there is a gap between the second sub-plate and the source/drain pattern.

7. The display substrate according to claim 6, wherein an orthographic projection of the second sub-plate on the base substrate is within an orthographic projection of the first sub-plate on the base substrate.

8. The display substrate according to claim 6, wherein the pixel unit further comprises a buffer layer, a gate insulating layer and a gate, the buffer layer is disposed between the light shielding layer and the active layer, and the active layer, the gate insulating layer, the gate, an interlayer dielectric layer and the source/drain pattern constitute a thin film transistor; and the insulating layer between the light shielding layer and the source/drain pattern comprises the buffer layer and the interlayer dielectric layer.

9. The display substrate according to claim 8, wherein the connection hole runs through the interlayer dielectric layer.

10. The display substrate according to claim 9, wherein the first sub-plate is in direct contact with the buffer layer, and the second sub-plate is in direct contact with a side of the interlayer dielectric layer farther away from the base substrate.

11. The display substrate according to claim 8, wherein the gate has a single-layer structure or a multi-layer structure.

12. The display substrate according to claim 8, wherein the active layer, the gate insulating layer, the gate, the interlayer dielectric layer and the source/drain pattern are disposed in a direction away from the base substrate;

the source/drain pattern comprises a source and a drain;

an orthographic projection of the gate insulating layer on the base substrate is coincident with an orthographic projection of the gate on the base substrate;

the interlayer dielectric layer comprises a source via hole and a drain via hole, the source is in contact with the active layer by the source via hole, and the drain is in contact with the active layer by the drain via hole; and the pixel electrode is electrically connected to the drain by the pixel via hole.

13. The display substrate according to claim 1, wherein an orthographic projection of the transparent conductive thin film in the light shielding layer on the base substrate covers an orthographic projection of the light-shielding conductive thin film in the light shielding layer on the base substrate.

14. The display substrate according to claim 1, wherein the second plate and the active layer are disposed at a same layer.

15. The display substrate according to claim 1, wherein display substrate comprises a passivating layer, the passivating layer is at a side of the source/drain pattern farther away from the base substrate, and the source/drain pattern is a transparent pattern.

16. The display substrate according to claim 1, wherein a material of the first plate comprises metal oxide, and a material of the second plate comprises a conductive semiconductor material.

17. The display substrate according to claim 1, wherein the light-shielding conductive thin film comprises a first light-shielding thin film and a second light-shielding thin film which are superimposed.

18. The display substrate according to claim 17, wherein a material of the first light-shielding thin film differs from that of the second light-shielding thin film, or is as same as that of the second light-shielding thin film.

19. The display substrate according to claim 18, wherein in a case that the material of the first light-shielding thin film differs from that of the second light-shielding thin film, the material of the first light-shielding thin film comprises MoNb alloy and the material of the second light-shielding thin film comprises Cu.

20. A display device, comprising the display substrate according to claim 1.

* * * * *